United States Patent
Lehr et al.

(10) Patent No.: US 9,136,234 B2
(45) Date of Patent: Sep. 15, 2015

(54) SEMICONDUCTOR DEVICE WITH IMPROVED METAL PILLAR CONFIGURATION

(71) Applicant: GLOBALFOUNDRIES Inc., Grand Cayman (KY)

(72) Inventors: Matthias Lehr, Dresden (DE); Marcel Wieland, Radebeul (DE); Martin O'Toole, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 45 days.

(21) Appl. No.: 13/937,361

(22) Filed: Jul. 9, 2013

(65) Prior Publication Data

US 2015/0014843 A1    Jan. 15, 2015

(51) Int. Cl.
*H01L 23/48* (2006.01)
*H01L 23/00* (2006.01)

(52) U.S. Cl.
CPC ............ *H01L 24/11* (2013.01); *H01L 24/13* (2013.01); *H01L 2224/0401* (2013.01); *H01L 2224/05624* (2013.01); *H01L 2224/1146* (2013.01); *H01L 2224/1147* (2013.01); *H01L 2224/1308* (2013.01); *H01L 2224/13111* (2013.01); *H01L 2224/13139* (2013.01); *H01L 2224/13147* (2013.01); *H01L 2224/16225* (2013.01); *H01L 2224/32225* (2013.01); *H01L 2224/73204* (2013.01); *H01L 2924/351* (2013.01)

(58) Field of Classification Search
CPC .................. H01L 21/76834; H01L 21/76846; H01L 21/76849; H01L 21/76858; H01L 21/76886; H01L 21/76888; H01L 24/03; H01L 24/05; H01L 24/11; H01L 23/53233; H01L 23/53238
USPC .................................. 257/737; 438/613, 653
See application file for complete search history.

(56) References Cited

U.S. PATENT DOCUMENTS

| 8,039,958 | B2 | 10/2011 | Platz et al. | |
| 8,405,199 | B2 * | 3/2013 | Lu et al. | 257/692 |
| 2012/0012985 | A1 * | 1/2012 | Shen et al. | 257/618 |
| 2013/0140563 | A1 * | 6/2013 | Kao et al. | 257/48 |

* cited by examiner

*Primary Examiner* — Trung Q Dang
(74) *Attorney, Agent, or Firm* — Amerson Law Firm, PLLC

(57) ABSTRACT

When forming sophisticated semiconductor devices including metal pillars arranged on contact pads, which may comprise aluminum, device performance and reliability may be improved by avoiding exposure of the contact pad material to the ambient atmosphere, in particular during and between dicing and packaging processes. To this end, the contact pad material may be covered by a protection layer or may be protected by the metal pillars itself, thereby concurrently improving mechanical stress distribution in the device.

22 Claims, 14 Drawing Sheets

SEMICONDUCTOR DEVICE WITH IMPROVED METAL PILLAR CONFIGURATION

BACKGROUND OF THE INVENTION

1. Field of the Invention

Generally, the present disclosure relates to integrated circuits, and, more particularly, to techniques for improving contact structures providing electrical and thermal chip-package connections.

2. Description of the Related Art

Semiconductor devices are typically formed on substantially disc-shaped substrates made of any appropriate semiconductor material. The majority of semiconductor devices including highly complex electronic circuits are currently and, in the foreseeable future, will be manufactured on the basis of silicon, thereby rendering silicon substrates and silicon-containing substrates, such as SOI (silicon-on-insulator) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing the number of devices per substrate.

In addition to increasing the substrate area, it is also important to optimize the utilization of the substrate area for a given substrate size so as to actually use as much substrate area as possible for semiconductor devices and/or test structures that may be used for process control. In the attempt to maximize the useable surface area for a given substrate size, the feature sizes of circuit elements are steadily scaled down. Due to this ongoing demand for shrinking the feature sizes of the circuit elements of highly sophisticated semiconductor devices and consequently also of the structures connecting the circuit elements, copper in combination with a low-k dielectric material has become a frequently used alternative in the formation of the so-called interconnect structures comprising metal line layers and inter-mediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and to provide the required I/O (input/output), power and ground contact pads of the circuit design under consideration. The stacked metal line layers and via layers form a metallization system, wherein the contact pads may be formed in or on the upper or last metallization layer and may comprise any appropriate metal or alloy comprising, e.g., aluminum, copper, platinum, gold or silver. A passivation system comprising silicon nitride, silicon oxide, silicon carbide and/or organic passivation layers such as, e.g., polyimide, may be formed above the metallization system and on the contact pads. An opening is formed in the passivation system by well-established lithography and etching techniques so that the contact pads are at least partially exposed to allow for electrically and thermally connecting the device, e.g., with a package substrate. The exposed contact pad material, however, may be adversely affected, e.g., by the ambient atmosphere during and between dicing and packaging processes, in particular when sensitive materials such as copper and aluminum are employed.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased in combination with a reduced conductivity of the lines due to a reduced cross-sectional area. For this reason, traditional dielectrics such as silicon dioxide (k>4) and silicon nitride (k>7) are replaced by dielectric materials having a lower permittivity, which are, therefore, also referred to as low-k dielectrics having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k and ultra low-k (ULK) dielectric layers, and their adhesion to other materials.

In addition to the problems of reduced mechanical stability of advanced dielectric materials having a dielectric constant of 3.0 and significantly less, device reliability may be affected by these materials during operation of sophisticated semiconductor devices due to an interaction between the chip and the package caused by a thermal mismatch of the corresponding thermal expansion of the different materials. For instance, in the fabrication of complex integrated circuits, increasingly a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump structure may be formed on the last metallization layer, for instance comprised of a solder material, which may be brought into contact with respective contact pads of the package. Thus, after reflowing the bump material, a reliable electrical and mechanical connection may be established between the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities, which may be required for complex integrated circuits, such as CPUs, storage memories and the like.

During the corresponding process sequence for connecting the bump structure with a package carrier, a certain degree of pressure and/or heat may be applied to the composite device so as to establish a reliable connection between each of the bumps formed on the chip and the bumps or pads that may be provided on the package substrate. The thermally or mechanically induced stress may, however, also act on the lower-lying metallization layers, which may typically include low-k dielectrics or even ultra low-k dielectric materials, thereby significantly increasing the probability of creating defects by delamination of these sensitive materials due to reduced mechanical stability and adhesion to other materials.

Moreover, during operation of the finished semiconductor device attached to a corresponding package substrate, also significant mechanical stress may occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which typically may exhibit a different thermal conductivity and a coefficient of thermal expansion compared to the silicon chip.

The thermal and electrical performance of a "bump structure" may be further increased by providing metal pillars instead of solder bumps or balls, thereby reducing the required floor space for individual contact elements. Furthermore, the thermal and electrical conductivity may be enhanced due to the superior characteristics of the employed metals compared to typically used solder material, in particular when metals exhibiting a high conductivity, such as, e.g., copper, silver or copper alloys, are used for forming the pillars. A semiconductor device comprising metal pillars may be described in more detail with reference to FIG. 1a.

FIG. 1a schematically illustrates a cross-sectional view of a semiconductor device 100 comprising a conventional metal pillar configuration. The semiconductor device 100 may typically comprise a substrate 101, for instance a silicon substrate or an SOI substrate, depending on the overall configuration of the circuit layout and the performance of the manufactured integrated circuit. Moreover, a silicon-based semiconductor layer 102 may typically be provided above the substrate 101, wherein the semiconductor layer 102 may comprise a very large number of circuit elements, such as transistors 155, capacitors (not shown), resistors (not shown) and the like, as are required for the desired functional behavior of the integrated circuit. As previously discussed, the ongoing shrinkage of critical dimensions of circuit elements may result in critical dimensions of transistors on the order of magnitude of 40 nm and significantly less in presently available sophisticated semiconductor devices produced by volume production techniques. The semiconductor device 100 comprises a metallization system 110, which, in advanced devices, comprises a plurality of metallization layers 120, 130, 140, i.e., of device levels, in which metal lines 135 and vias 134 and possibly contact metal regions 145 are embedded in an appropriate dielectric material. As discussed above, at least a portion of the corresponding dielectric materials used in the various metallization layers is usually comprised of materials of reduced mechanical stability in order to reduce the parasitic capacitance of adjacent metal lines 135. As previously explained, the pillar structure 166 may be provided above the metallization system 110, wherein the corresponding metal pillars 166 are provided on a contact pad 181 formed on the very last metallization layer 140 of the metallization system 110. The contact pad 181 may be encapsulated by a passivation layer 161. A metal layer system 165 comprising two or more sub-layers is arranged between the metal pillar 166 and the contact pad 181. The metal layer system 165 may comprise metals, such as, e.g., titanium, copper, chromium, tungsten or gold or combinations thereof, that are appropriate to provide a reliable interface with regard to adhesion of the pillar and pad materials. Furthermore, the upper layer of the metal layer system 165 may serve as a seed layer. The metal layer system 165 may further provide the required current distribution functionality in case the metal pillar is formed by electrochemical plating techniques. The pillars may be formed by means of a resist mask (not shown) defining the size and position of the pillars. The corresponding resist mask may be formed by well-established lithography techniques.

After resist removal, also the exposed portions of the metal layer system 165 are removed by an appropriate etch chemistry using dry or wet etch processes, thereby exposing the passivation layer 161 and a portion of the contact pad 181. Subsequently, a further passivation layer 162 providing, in combination with passivation layer 161, a passivation layer system 160 formed on the device 100.

The processing up to this manufacturing stage may be performed on the basis of the substrate 101 comprising a plurality of die or chip regions. Frequently, the further processing may be continued in a remote manufacturing facility in which dedicated process equipment and manufacturing strategies are implemented so as to finalize the device, which typically includes dicing the substrate into individual semiconductor chips and device packaging. Consequently, the substrate 101 may be transported to a different manufacturing environment which, however, may result in a certain degree of surface contamination, for instance by corrosion and the like.

The metal pillars may further contribute to an even more severe interaction between the package and the metallization system of the chip, since typically the metal pillars are significantly less deformable compared to the bump structures, which may be advantageous in view of electrical and thermal behavior, which, however, may result in even increased mechanical stress components in a locally very restricted manner when the chip is connected to a package substrate, as will be described in more detail with reference to FIG. 1b.

FIG. 1b schematically illustrates a cross-sectional view of an integrated circuit 150 comprising a semiconductor die or chip 100 connected to a package substrate 170 that is substantially comprised of an organic material, such as appropriate polymer materials and the like, wherein the connection between the chip 100 and the package substrate 170 may be accomplished by means of a pillar structure 166. The package substrate 170 comprises appropriately positioned and dimensioned contact pads 190 which may be brought into contact with corresponding pillars or any solder material formed thereon, in order to establish respective mechanical and electrical connections upon application of heat and/or mechanical pressure. Furthermore, the package substrate 170 usually comprises appropriate conductive lines in order to connect the upper portion of the pillar structure 166 with corresponding terminals, which then establish an electrical interface to other peripheral components, such as a printed wiring board and the like. For convenience, any such conductive lines are not shown. A gap formed between the chip 100 and the package substrate 170 is filled by an appropriate underfill material 175, wherein the underfill material 175 may come in contact with exposed portions of the contact pads 181.

During operation of the integrated circuit 150, heat is generated within the semiconductor chip 100, for instance caused by the circuit elements, e.g., transistor 155 (FIG. 1a) formed in and above the semiconductor layer 102. This waste heat is dissipated, for instance, by the metallization system 110 and the pillar structure 166 in a highly efficient manner and/or via the substrate 101, depending on the overall thermal conductivity of the substrate 101. For example, the heat dissipation capability of SOI substrates is significantly less compared to pure silicon substrates due to the reduced thermal conductivity of the buried insulating oxide layer, which separates the semiconductor layer 102 from the remaining substrate material. Thus, a major heat dissipation path is provided by the pillar structure 166 and the package substrate 170. Consequently, a moderately high average temperature is created in the semiconductor chip 100 and also in the package substrate 170, wherein, as previously discussed, a mismatch in the coefficient of thermal expansion between these two components may cause a significant mechanical stress. The package substrate 170 may have an increased thermal expansion compared to the semiconductor chip 100, wherein a corresponding mismatch, therefore, results in a significant degree of thermal stress, in particular at the "interface" between the semiconductor chip 100 and the package substrate 170, that is, in particular, the pillar structure 166 and the metallization system 110 may experience significant sheer forces caused by the thermal mismatch during the operation of the integrated circuit 150. Due to the reduced mechanical stability and the reduced adhesion of sophisticated dielectric materials, corresponding defects may occur, which may affect the overall reliability of the integrated circuit 150. In particular, the stiffness of the individual pillars of the pillar structure 166 may result in locally high sheer forces, which are transferred into the entire metallization system, thereby resulting in delamination defects and the like.

The height of the metal pillars may be adjusted so that the spacing between the package substrate and the chip is appropriate for a reliable filling in of an underfill material 175 that may reduce sheer forces transferred into the metallization system. Voids in the underfill material or insufficient adhesion of the underfill material 175 to the exposed portions of contact pads 181, however, may also contribute to a high degree of non-reliability, for instance caused by non-uniformities in heat conductivity and the like.

Consequently, although advanced contact regimes between a chip and a package substrate based on metal pillars may provide significant advances with respect to heat dissipation capabilities and electrical conductivity for a reduced required floor space, thereby allowing enhanced density of contact elements and/or dummy elements for heat dissipation, the increased mechanical stress induced in the metallization system and/or insufficient adhesion of the underfill material to exposed portions of contact pads 181 may not be compatible with the reliability requirements of the semiconductor devices.

In view of the situation described above, the present disclosure relates to methods and semiconductor devices in which a pillar structure may be provided, while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and manufacturing techniques in which a metal pillar configuration is improved so that exposure of material of the contact pad supporting the metal pillar to the ambient atmosphere or to an etch chemistry after metal pillar formation is avoided or at least reduced. The exposure of the contact pad may be reduced by forming a protection layer above the contact pad and/or by forming a metal pillar which laterally extends over a portion of a passivation layer embedding the contact pad.

The protection layer may be formed on the contact pad prior to forming the passivation layer and prior to forming a metal layer system providing an appropriate basis for the metal pillar formation. Thus, the etch process performed after pillar formation to remove the metal layer system does not attack the contact pad as it is protected by the protection layer during the etch step. In other illustrative embodiments, the protection layer may be formed after the pillar on regions of the contact pad exposed between the passivation layer and the pillar. The protection layer avoids exposure of the contact pad to an ambient atmosphere in subsequent manufacture, transport and storage periods, which may last up to several weeks until the final packaging is performed.

In case the exposure of the contact pad is avoided by forming pillars which laterally extend over the passivation layer, the etch chemistry—employed to remove the metal layer system—also does not attack the contact pad as, in this case, the metal layer system is removed only from portions of the passivation layer. Consequently, the exposure of the contact pad to ambient atmosphere is also avoided. Furthermore, since the metal pillar is laterally embedded by the passivation layer, the sheer forces that may occur during manufacturing and operating of the device may be at least partially transferred to the passivation layer so that the transfer to the damageable low-k dielectrics of the metallization system may be reduced so that the local stress load may be maintained at an acceptable level.

One illustrative method disclosed herein includes forming a contact pad above a substrate having circuit elements. The method further includes forming a protection layer protecting the contact pad. The method further includes depositing a passivation layer embedding the contact pad, forming an opening in the passivation layer and depositing a metal layer system. The method further includes forming a metal pillar on the metal layer system in the opening and removing exposed portions of the metal layer system.

A further illustrative method disclosed herein includes providing a substrate and forming a contact metal layer comprising aluminum above the substrate. The method further includes forming a contact pad by patterning the contact metal layer and depositing a passivation layer embedding the contact pad. The method further includes forming an opening in the passivation layer to expose a portion of the contact pad and forming a metal layer system above the semiconductor device. The method further includes forming a metal pillar on the metal layer system in the opening and partially above the passivation layer so that a portion of the metal pillar is laterally embedded by the passivation layer and removing exposed regions of the metal layer system.

One illustrative semiconductor device disclosed herein includes a contact pad and a protection layer formed on the contact pad. The semiconductor device further includes a passivation layer embedding the contact pad. Furthermore, a metal pillar is disposed above the contact pad and a metal layer system is disposed between the contact pad and the metal pillar.

A further illustrative semiconductor device disclosed herein includes a contact pad comprising aluminum and a passivation layer embedding the contact pad. Furthermore, a metal pillar is arranged above the contact pad and partially above the passivation layer so that a portion of the metal pillar is laterally embedded by the passivation layer. Moreover, a metal layer system is disposed between the metal pillar and the contact pad and between the metal pillar and the passivation layer.

BRIEF DESCRIPTION OF THE DRAWINGS

The disclosure may be understood by reference to the following description taken in conjunction with the accompanying drawings, in which like reference numerals identify like elements, and in which.

Figure 1A:
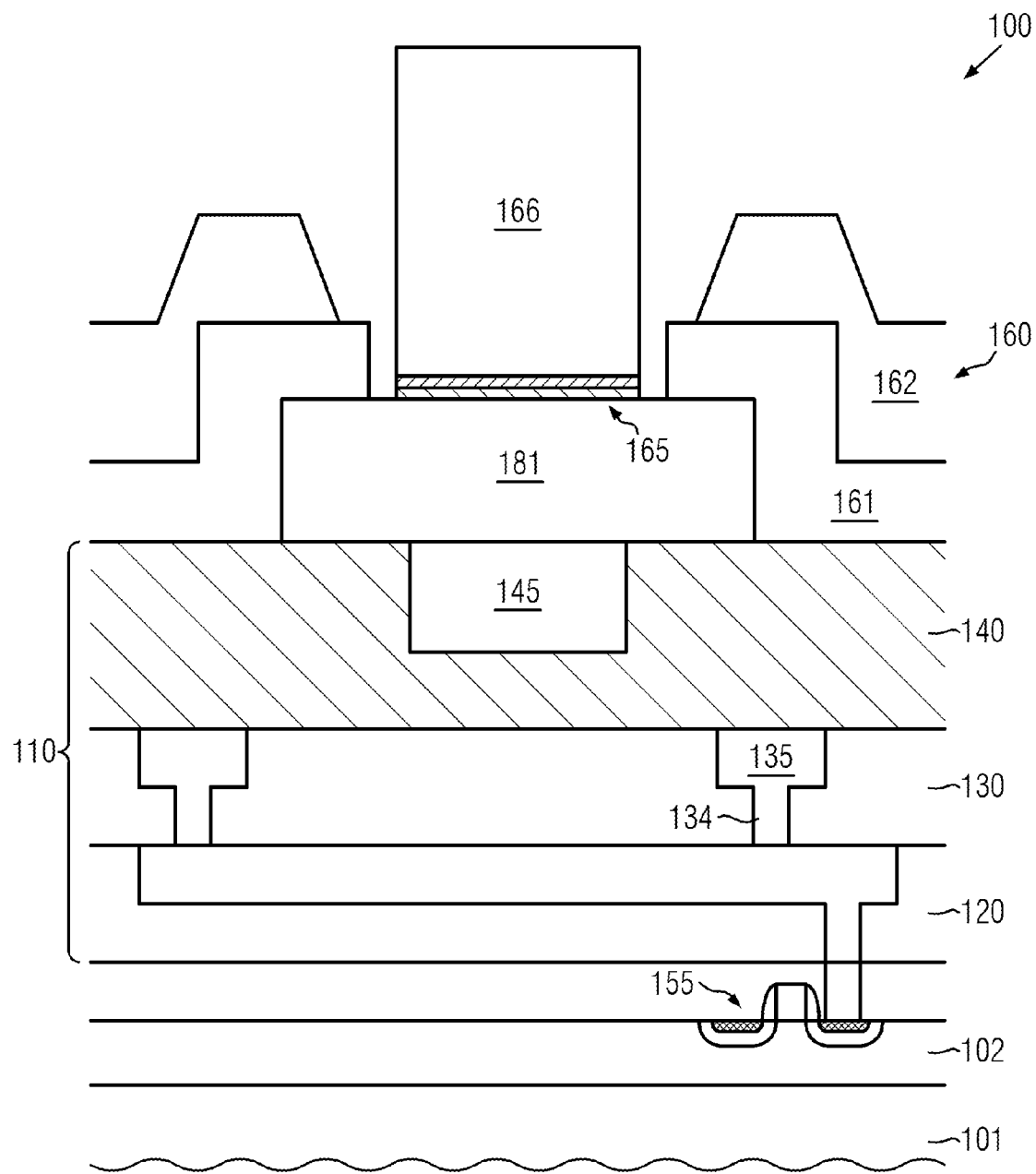
FIG. 1a schematically illustrates a cross-sectional view of a semiconductor device having a metal pillar configuration, according to a conventional design.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, the present disclosure provides semiconductor devices and techniques in which sophisticated metallization systems and metal pillars may be efficiently used for providing electrical and thermal connections to semiconductor chips, wherein the reliability of the semiconductor device is improved by avoiding or reducing exposure of sensitive contact pad material to aggressive etch chemistries and/or to the ambient atmosphere that may otherwise lead to removal or corrosion of the pad material. The exposure of the contact pad may be reduced by forming a protection layer above the contact pad and/or by forming pillars which laterally extend over a portion of a passivation layer embedding the contact pad.

The protection layer may be formed on the contact pad prior to forming the passivation layer and prior to forming a metal layer system providing an appropriate basis for the metal pillar formation. Thus, the etch process performed after pillar formation to remove the metal layer system does not attack the contact pad as it is protected by the protection layer during the etch step. In other illustrative embodiments, the protection layer may be formed after the pillar on regions of the contact pad exposed in a gap formed between the passivation layer and the pillar. The protection layer avoids exposure of the contact pad to an ambient atmosphere in subsequent manufacture, transport and storage periods which may last up to several weeks until the final packaging is performed.

Furthermore, metal pillars which laterally extend over a portion of the passivation layer embedding the contact pad may efficiently reduce the local stress load exerted by the metal pillars to the metallization layer system by transferring sheer stresses—occurring during manufacturing and operating the semiconductor device—to the passivation layer embedding the metal pillars. This is achieved by reducing the width or diameter of the corresponding opening in the passivation layer relative to the diameter of the metal pillars. Consequently, respective geometrical configuration of the metal pillar may be selected in accordance with well-established process strategies, that is, an appropriate height thereof may be used so as to ensure a proper spacing between the semiconductor chip and the corresponding package substrate, while nevertheless a reduced local stress load may occur in the vicinity of the corresponding metal pillars, thereby allowing the usage of sophisticated metallization regimes.

Figure 1B:
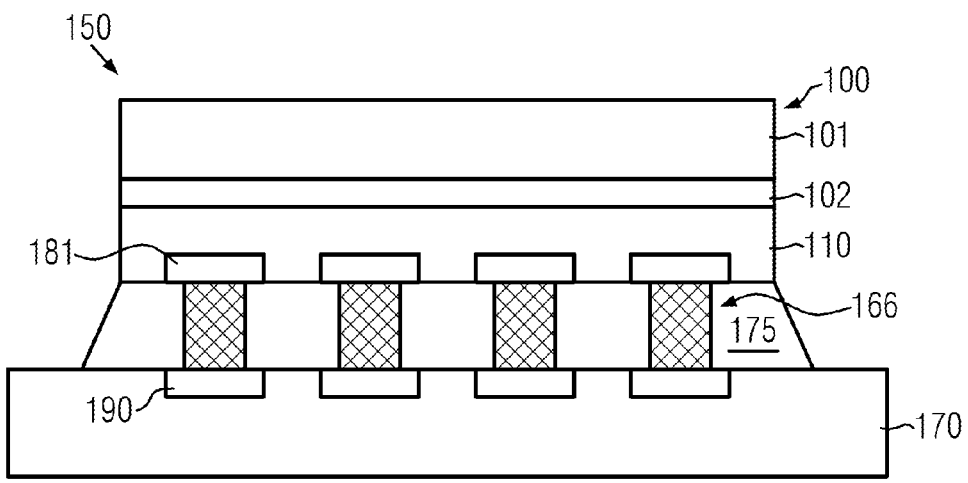
FIG. 1b schematically illustrates a cross-sectional view of an integrated circuit including a semiconductor chip and a package substrate connected by a pillar structure, according to a conventional design.

With reference to FIGS. 2a-2h, further illustrative embodiments will now be described in more detail, wherein reference may also be made to FIGS. 1a-1b, if appropriate.

Figure 2A:
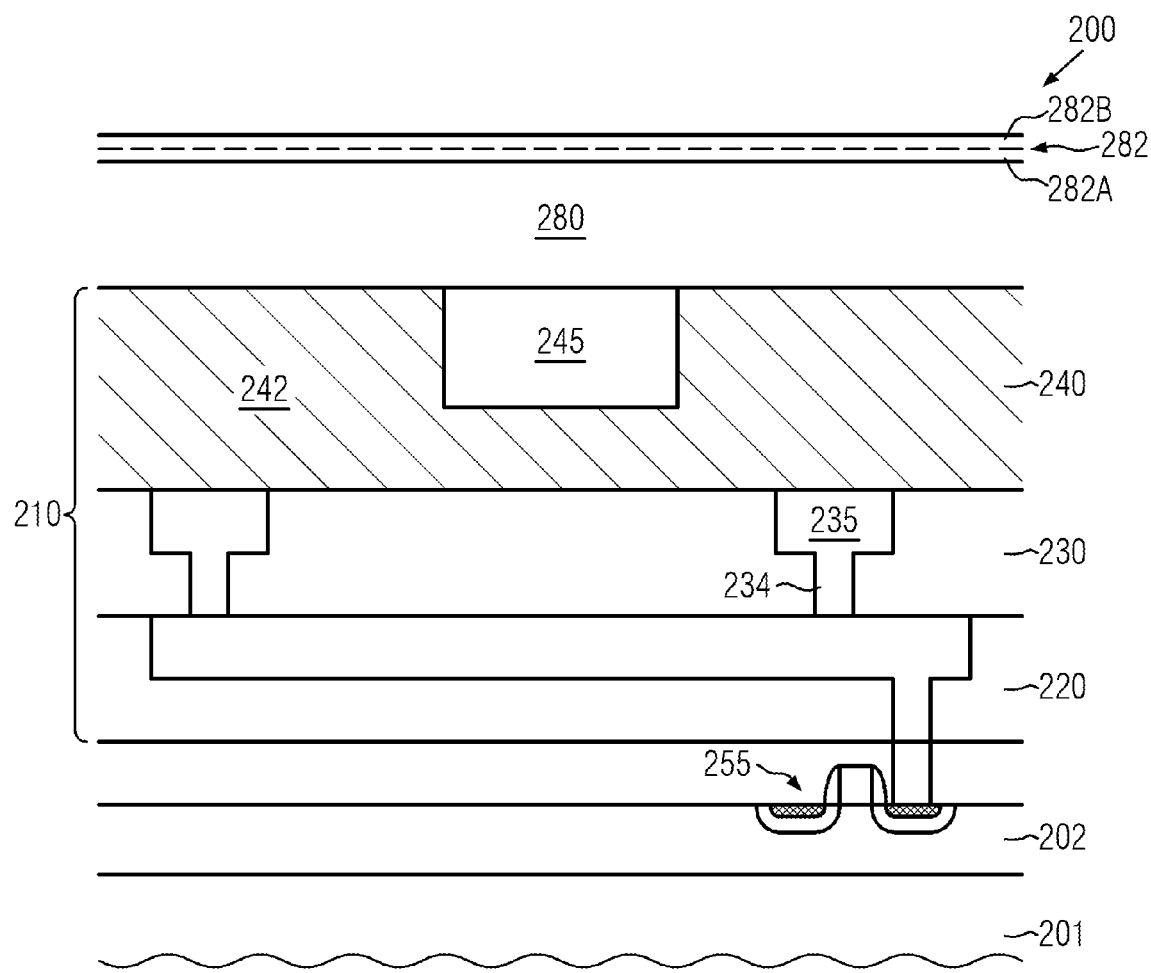
FIGS. 2a-2h schematically illustrate cross-sectional views of a semiconductor device during various manufacturing stages in forming a metal pillar on a metallization system based on a metal pillar configuration comprising a protection layer, according to the present invention.

FIG. 2a schematically illustrates a cross-sectional view of a semiconductor device 200 in an advanced manufacturing stage. As illustrated, the semiconductor device 200 may comprise a substrate 201, such as a silicon substrate, an SOI substrate and the like, as is required for the overall configuration of the device 200. Moreover, a device level or semiconductor layer 202 may be formed above the substrate 201 and may comprise a large number of circuit elements, such as transistors 255, capacitors (not shown), resistors (not shown) and the like, which may be formed on the basis of appropriate design rules corresponding to the device 200. For instance, critical dimensions of circuit elements in the device level 202 may be approximately 40 nm or less, depending on the overall device requirements. It should be appreciated that, although the techniques disclosed herein are highly advantageous in the context of complex semiconductor devices, a corresponding regime for forming a pillar structure may also be advantageously applied to less critical semiconductor devices in which the circuit elements may have critical dimensions of more than 40 nm. Furthermore, the semiconductor device 200 may comprise a metallization system 210 which typically includes a plurality of metallization layers 220, 230, 240, at least some of which may, in some illustrative embodiments, include sensitive dielectric materials, as previously discussed. Moreover, a last metallization layer 240 may have formed therein a metal region 245 on which a contact pad is to be formed. It should be appreciated that, in sophisticated metallization systems, the metal lines and vias may be provided on the basis of a copper material due to superior characteristics in view of thermal and electrical conductivity, as is also previously discussed. It should be appreciated, however, that also metallization systems including other materials, such as aluminum, silver and the like, possibly in combination with other metals, may also be contemplated herein. Moreover, the metal region 245 may comprise any appropriate barrier material (not shown), if required, in order to reliably confine a corresponding metal, such as copper, when a direct contact of the metal with the surrounding dielectric material 242 may be considered inappropriate.

A contact metal layer 280 which may be comprised of any appropriate material, such as aluminum or aluminum/copper, may be formed on the last metallization layer 240. In one illustrative embodiment, the contact metal layer 280 may comprise an alloy comprising at least approximately 90% aluminum. In a further illustrative embodiment, the contact metal layer comprises approximately 99 atomic percent and more aluminum and 1 atomic percent and less copper. In a further embodiment, the contact metal layer 280 may comprise an alloy comprising approximately 99.5% aluminum and approximately 0.5% copper. A protection material layer 282, which may be comprised of any appropriate material which exhibits a desired adhesion to the contact metal layer 280 and a desired etch resistivity with regard to the lowest respectively first layer of the subsequently deposited metal layer system 265 (see FIG. 2*d*), may be deposited on the contact metal layer 280. The protection material layer 282 may comprise, e.g., titanium aluminum nitride (TiAlN), titanium nitride (TiN), titanium (Ti), tantalum nitride (TaN) or tantalum (Ta). In one illustrative embodiment, the protection material layer 282 may be provided as a multi layer such as a double layer comprising a lower sub-layer 282A and an upper sub-layer 282B. The lower sub-layer 282A may be provided as an adhesion and/or barrier layer comprising, e.g., titanium nitride (TiN), tantalum nitride (TaN) or the like. The material of lower sub-layer 282A may further be selected to provide a desired etch resistivity with regard to the lowest respectively first layer of the subsequently deposited metal layer system 265, when the upper sub-layer 282B is provided as a sacrificial layer. In one illustrative embodiment, the upper sub-layer 282B may comprise the material of the contact metal layer 280 so that the further deposition processes may be performed in a well-established manner with a conventional process parameter setting.

The semiconductor device 200 as shown in FIG. 2*a* may be formed on the basis of the following process strategy. Circuit elements in the device level 202 as well as the metallization system 210 including the metallization layers 220, 230 and 240 may be formed on the basis of well-established process strategies so that a high degree of compatibility with a desired technology standard and process flow may be maintained. The contact metal layer 280 may be blanket deposited on the metallization layer 240, e.g., by well-established chemical vapor deposition processes appropriate for forming conformal conductive layers, e.g., aluminum layers, with a thickness in the range of approximately 0.5-5 μm. In one illustrative embodiment, the aluminum layer may be deposited with a thickness in the range of approximately 1-3 μm. The protection material layer 282 that may comprise the upper and lower sub-layers 282A, 282B may be blanket deposited on the metallization layer 240, e.g., by well-established chemical vapor deposition (CVD) or physical vapor deposition (PVD) processes appropriate for forming thin conformal layers. The protection material layer 282 may be deposited with a thickness in the range of approximately 10-100 nm. In one illustrative embodiment, the protection material layer 282 may be deposited with a thickness in the range of approximately 20-50 nm. In a further illustrative embodiment, the upper and lower protection material layers 282A, 282B may be deposited with a thickness in the range of approximately 5-50 nm, respectively.

Figure 2B:
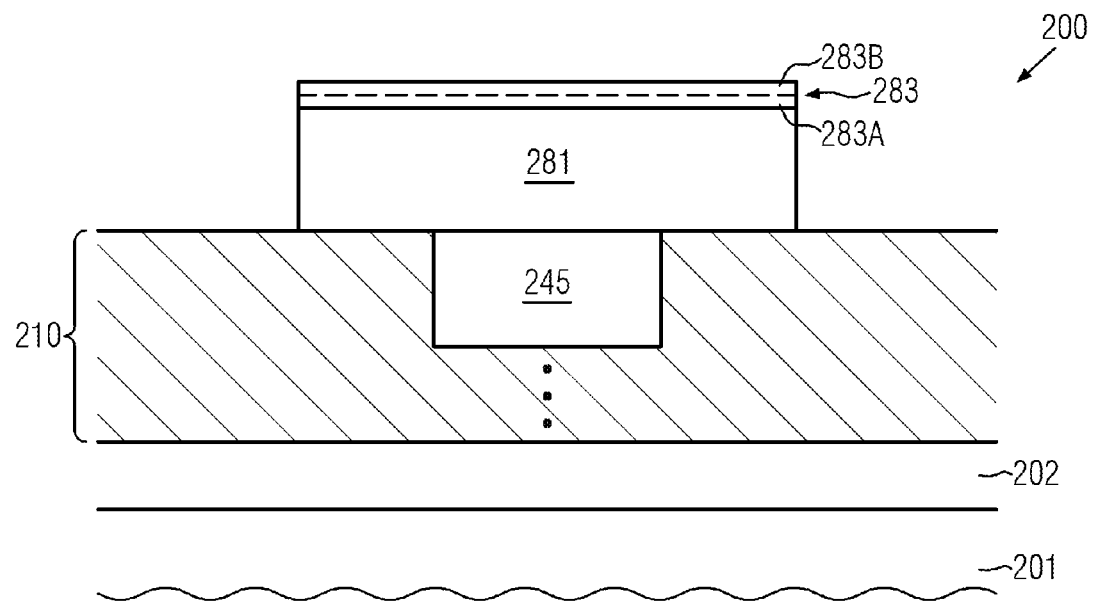

FIG. 2*b* schematically illustrates a cross-sectional view of the semiconductor device 200 in a further advanced manufacturing stage. As illustrated, the contact metal layer 280 and the protection material layer 282 that may comprise the upper and lower protection material layers 282A, 282B are patterned so that a contact pad 281 comprising a protection layer 283 that may comprise the upper and lower protection sub-layers 283A, 283B formed thereon are obtained by well-established patterning techniques. The lateral size of the contact pad is in the range of approximately 50-150 μm. The patterning may be performed by well-established lithography and etch techniques. For convenience, the metallization layer and the underlying layers of FIG. 2*a* are not depicted in FIG. 2*b* and are represented by vertical dots in FIG. 2*b* and the following figures.

Figure 2C:
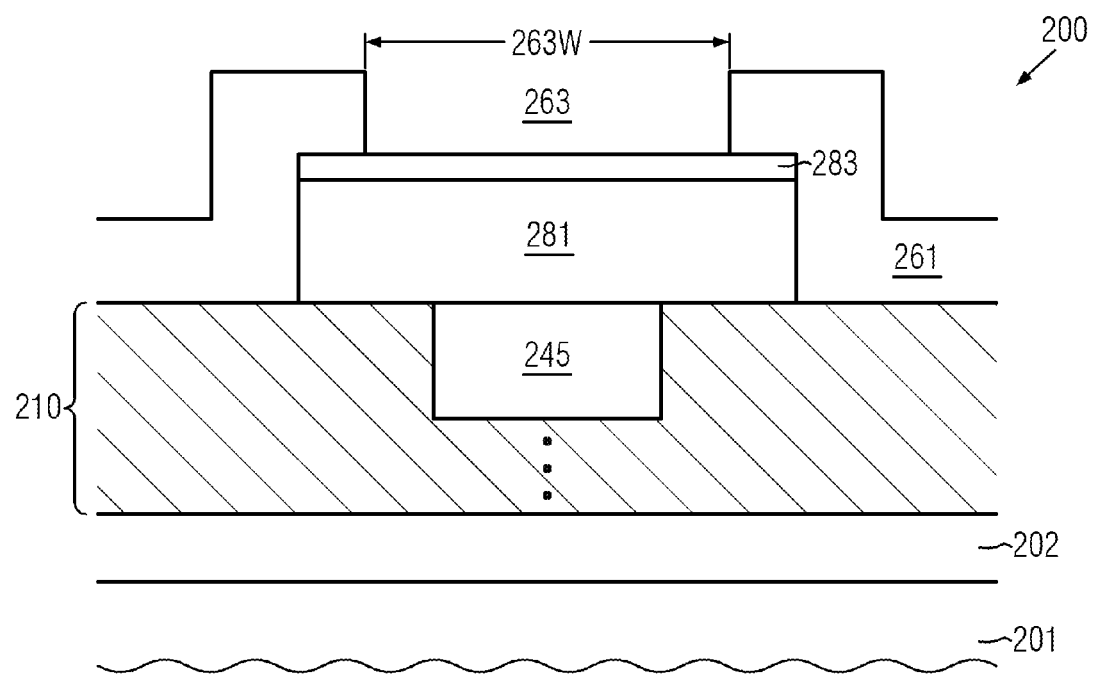

FIG. 2*c* schematically illustrates the semiconductor device 200 in a further advanced manufacturing stage in which a passivation layer 261 is formed on the semiconductor device 200 as depicted in FIG. 2*b*. The passivation layer 261 may be blanket deposited on the entire substrate 201 by a conformal CVD process, wherein conformal means that the thickness on the entire substrate does not differ more than 20%. The passivation layer 261 may comprise silicon nitride ($Si_3N_4$), silicon oxide ($SiO_2$) or silicon carbon nitride (SiCN) and may have a thickness in the range of approximately 0.2-3 μm. In one illustrative embodiment, the passivation layer 261 may have a thickness in the range of approximately 0.5-2 μm. In the manufacturing stage shown, an opening 263 may be formed in the passivation layer 261 so as to extend to the protection layer 283 covering the contact pad 281. The width 263W or diameter of the opening 263 may be chosen in accordance with well-established process strategies so that the corresponding characteristics of the passivation layer 261 and also the opening 263 may be compatible with conventional strategies for forming a metal pillar above the contact pad 281. That is, for a desired diameter of a metal pillar still to be formed of approximately 30-80 μm, the width 263W of the opening 263 may be in the range of approximately 50-100 μm.

The passivation layer 261 may be formed, for instance, by depositing a corresponding dielectric material and subsequently patterning the same by well-established lithography techniques.

Figure 2D:
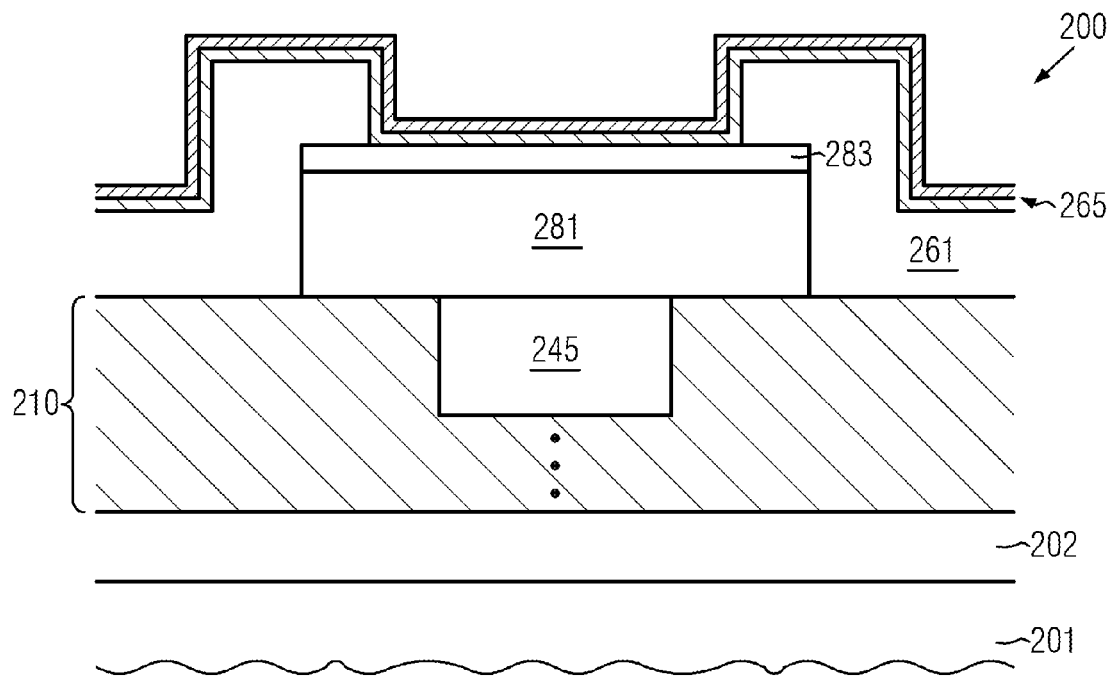

FIG. 2*d* schematically illustrates the semiconductor device 200 in a further advanced manufacturing stage. As illustrated, a metal layer system 265 is blanket deposited on the substrate so that the passivation layer 261 and a portion of the protection layer 283 exposed in the opening 263 (FIG. 2*c*) is covered by the metal layer system 265. The metal layer system 265 may be advantageous in view of enhanced adhesion of a metal for a pillar to be formed in the opening 263. For this purpose, any appropriate materials, such as chromium, copper, platinum, tantalum, tantalum nitride, titanium, tungsten and the like, or appropriate combinations of various materials may be used. In illustrative embodiments, a titanium/copper or titanium-tungsten/copper metal layer system 265 may be provided.

Figure 2E:
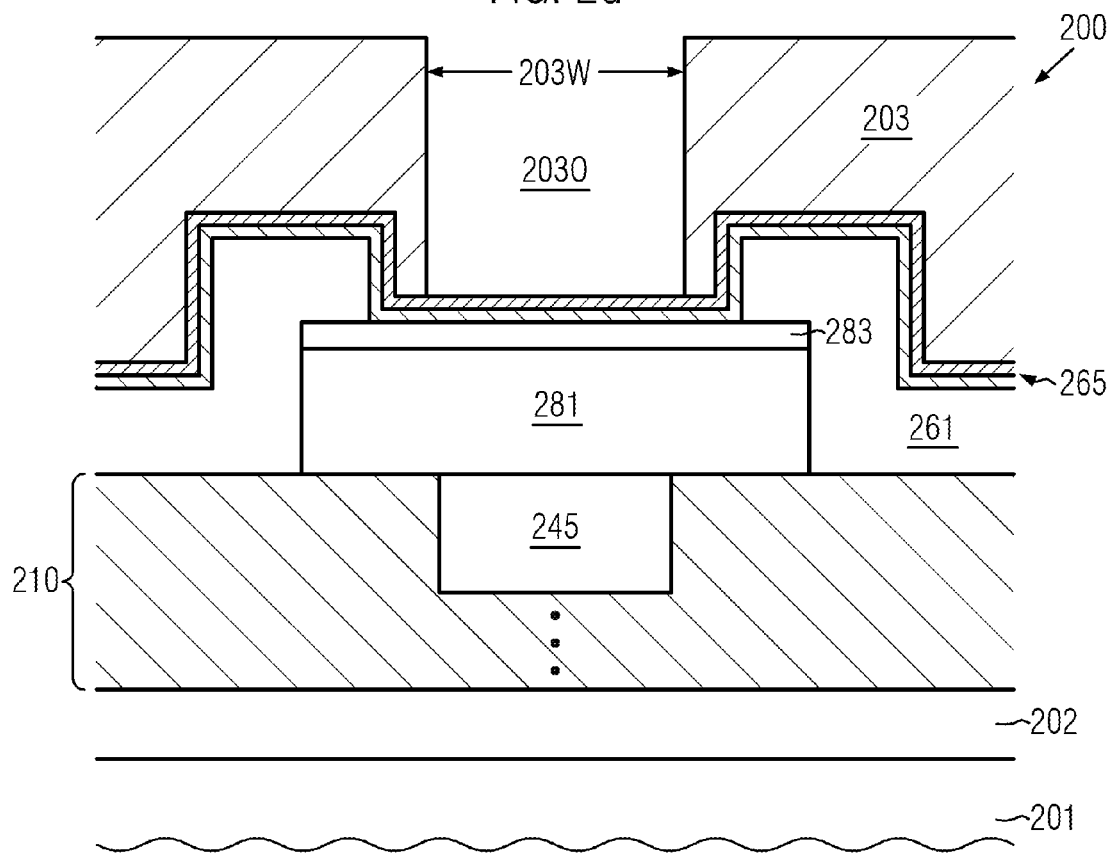

FIG. 2e schematically illustrates the semiconductor device 200 in a further advanced manufacturing stage in which a deposition mask 203, such as a resist mask, is formed above the metal layer system 265. The resist mask 203 comprises an opening 203O, wherein the lateral dimension 203W of the opening 203O may correspond to the diameter of the lateral size of the metal pillar to be formed in the opening 203O.

Figure 2F:
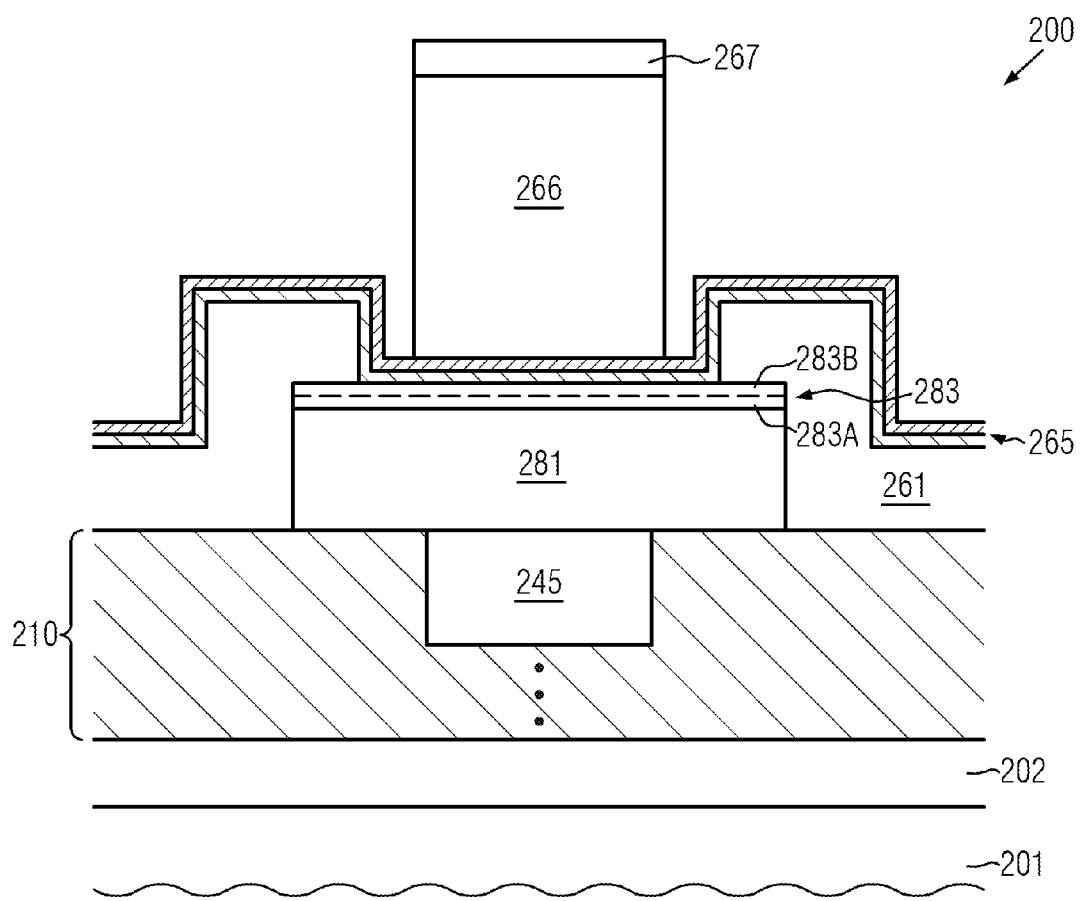

FIG. 2f schematically illustrates the semiconductor device 200 in an advanced manufacturing stage in which a metal pillar 266 is formed on the metal layer system 265 in the opening 203O (FIG. 2e). The metal pillar 266 may have a height of approximately 20-100 μm. In one illustrative embodiment, the metal pillar 266 may have a height of approximately 30-60 μm. The metal pillar 266 may comprise any appropriate material, such as copper, aluminum, tungsten and the like. The metal of the pillar may be deposited by electroless deposition techniques, wherein the upper layer of the metal layer system 265 may act as a catalyzing material. In an illustrative embodiment, the metal pillar 266 comprises copper, which may be deposited by an electroplating process, wherein the metal layer system 265 may act as a seed layer and as a current distribution layer. The copper pillar 266 may comprise a cap layer 267 which may comprise a leadless solder material, such as a tin/silver alloy. Thus, the cap layer may facilitate the packaging process, wherein the attachment of the packaging substrate is performed by means of a reflow process. The cap layer 267 may have a thickness of approximately 5-50 μm. In one illustrative embodiment, the cap layer 267 may have a thickness in the range of approximately 10-30 μm.

Figure 2G:
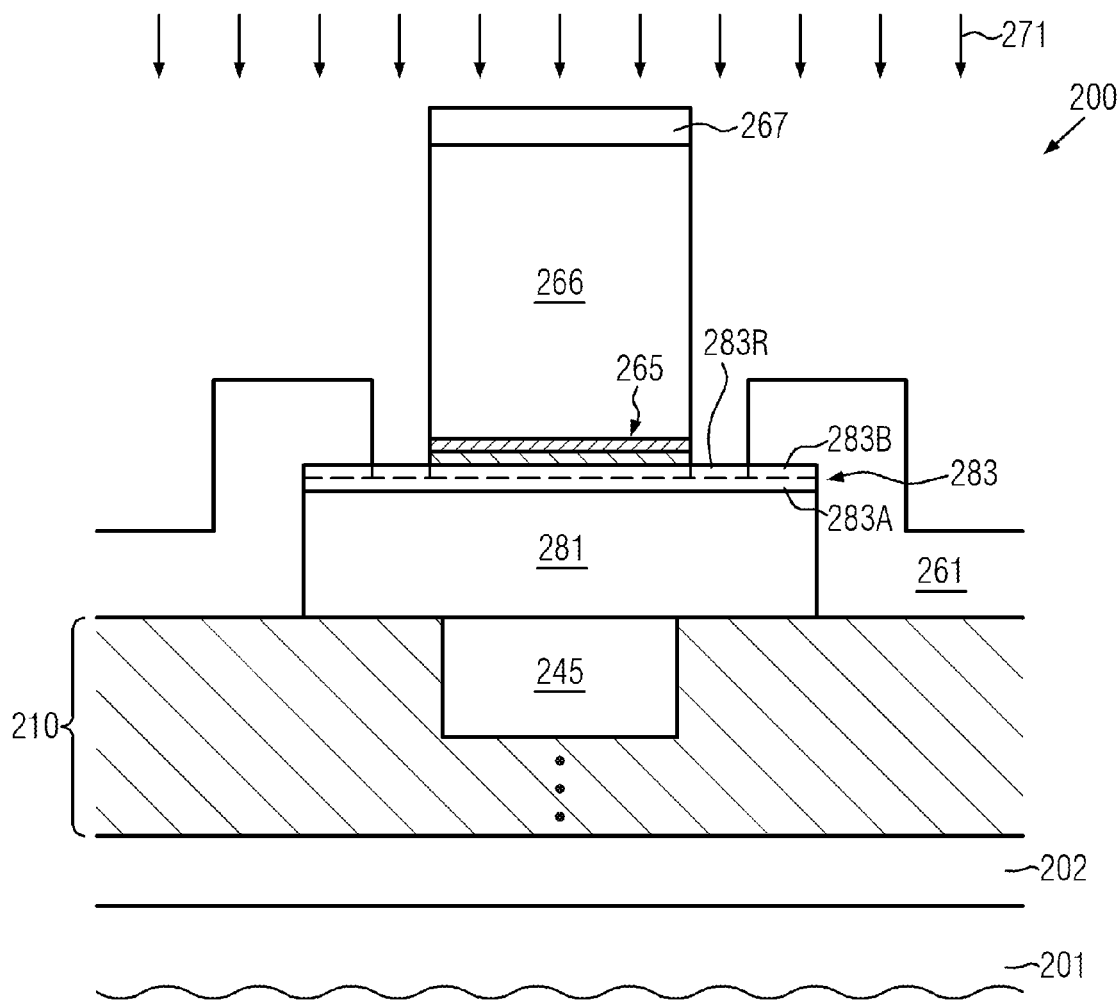

FIG. 2g schematically illustrates the semiconductor device 200 in a further advanced manufacturing stage in which exposed regions of the metal layer system 265 are removed. The removal of the layer 265 may be performed on the basis of an etch process 271 using well-established dry and/or wet etch chemistries depending on the material comprised in the metal layer system 265. The etch process 271 may be stopped in the protection layer 283 so that the employed etch chemistry does not attack and remove material of the contact pad 281. In case the protection layer 283 is provided as a double layer comprising a lower sub-layer 283A and an upper sub-layer 283B, the etch process 271 may be stopped at the upper sub-layer 283B or may remove the exposed portion of the upper sub-layer 283B partially or entirely so that a recess 283R is formed in the protection layer 283 adjacent to the metal pillar 266. When the upper sub-layer 283B comprises aluminum, an additional etch process on the basis of diluted hydrofluoric acid may be performed to remove remaining exposed aluminum reliably so that the lower sub-layer 283A is exposed in recess 283R. In a further illustrative embodiment, the exposed remaining aluminum may be oxidized, e.g., by a plasma oxidation process.

Figure 2H:
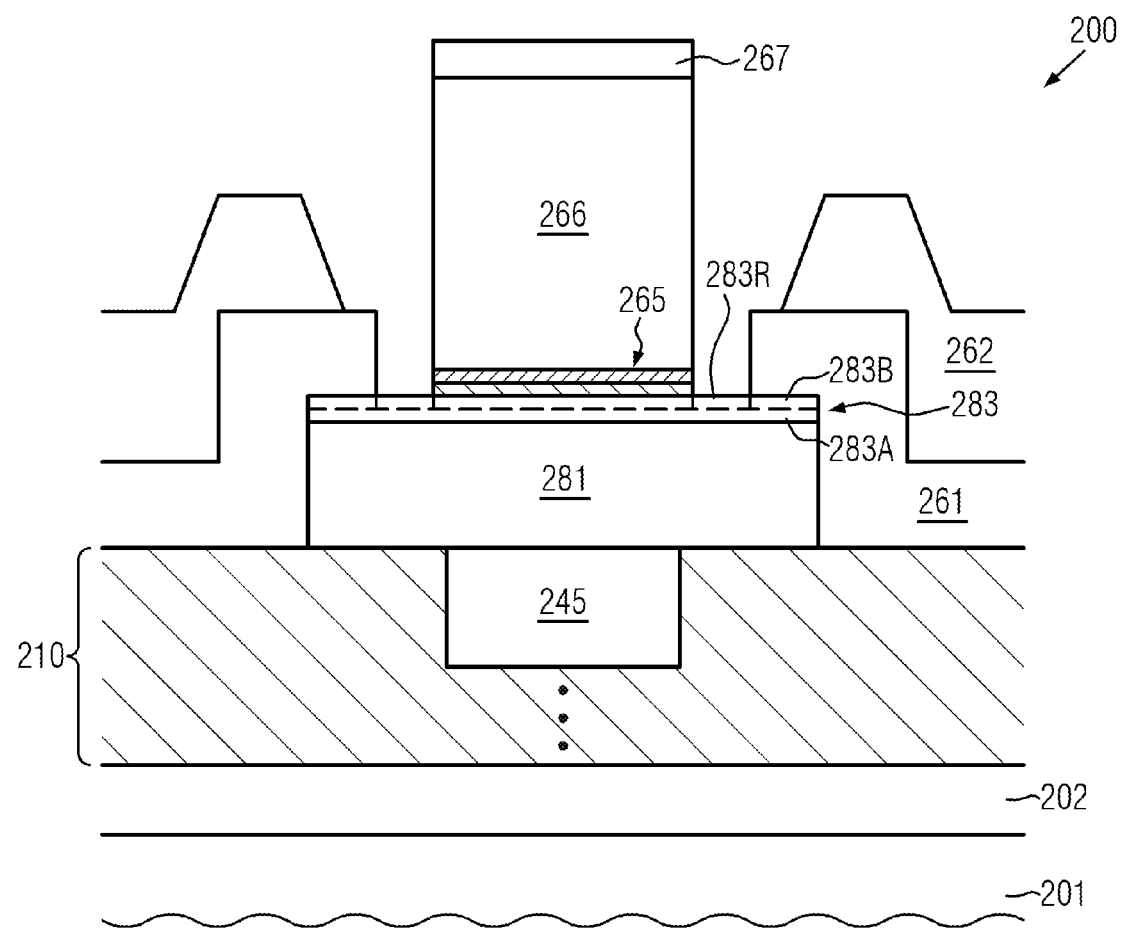

FIG. 2h schematically illustrates the semiconductor device 200 after a manufacturing process forming a final passivation layer 262 that may, for example, comprise polyimide. Now, the substrate 201 is ready for dicing and packaging. Since corresponding manufacturing processes are typically performed in remote manufacturing environments, it may last up to several weeks in which the devices 200 are stored, transported or processed, wherein the devices may be subjected to moisture and environmental chemicals so that, for example, corrosion of the contact pad material may be avoided due to the protection layer covering the contact pad material during these manufacturing processes. Furthermore, the contact pad material is also protected during packaging processes such as reflow and underfill processes so that these processes cannot adversely affect the contact pad material. Furthermore, the previously-described underfill process may be improved as the adhesion of underfill material to the protection layer 283 may be improved compared to corroded contact pad material.

With reference to FIGS. 3a-3f, further illustrative embodiments will now be described in detail, wherein reference may also be made to FIGS. 1a-1b and 2a-2h, if appropriate.

Figure 3A:
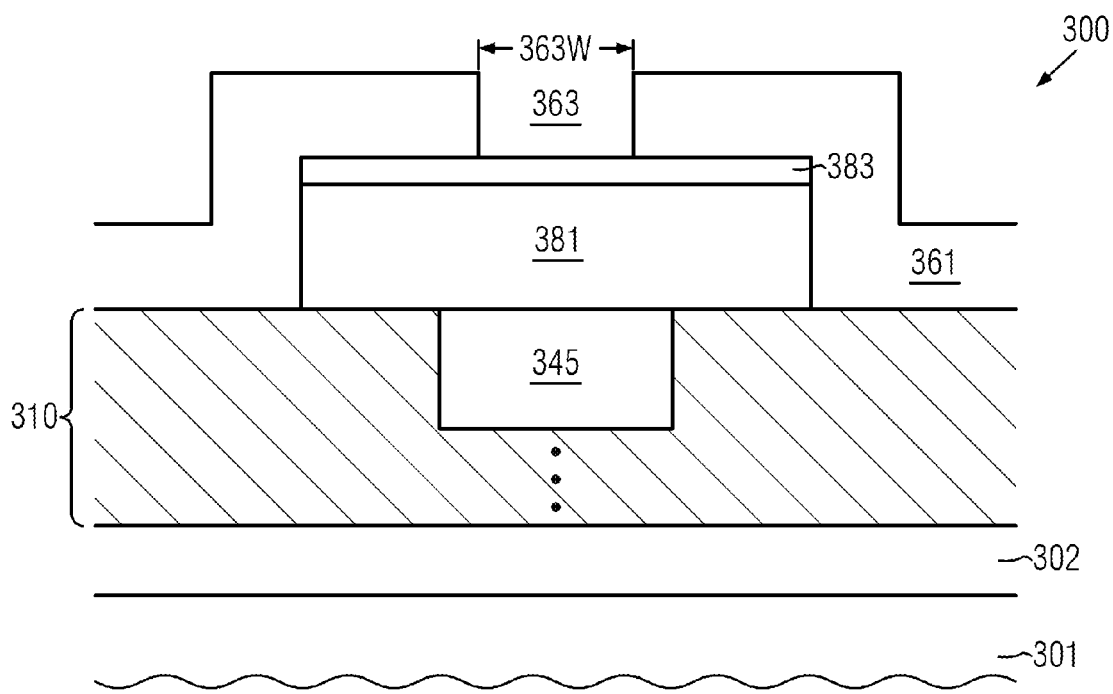
FIGS. 3a-3f schematically illustrate cross-sectional views of a semiconductor device based on a metal pillar configuration with a protection layer in which a lower portion of the metal pillar may be laterally embedded in a sub-layer of a passivation layer system, according to further illustrative embodiments.

FIG. 3a schematically illustrates the semiconductor device 300 in a manufacturing stage as depicted in FIG. 2c. The semiconductor device 300 may comprise a substrate 301, a device level or semiconductor layer 302 and a metallization system 310 comprising a metal region 345 formed above the substrate 301 as described with reference to FIG. 2a. The width 363W of the opening 363 formed in the passivation layer 361 is reduced compared to the width 263W of the opening 263 of device 200. The reduced width 363W is less than the width of a metal pillar 366 (FIG. 3d) to be formed in the opening 363 and above the passivation layer 361. Thus, the width 363W is in the range of approximately 20-60 μm. In one illustrative embodiment, the width 363W is in the range of approximately 30-50 μm.

Figure 3B:
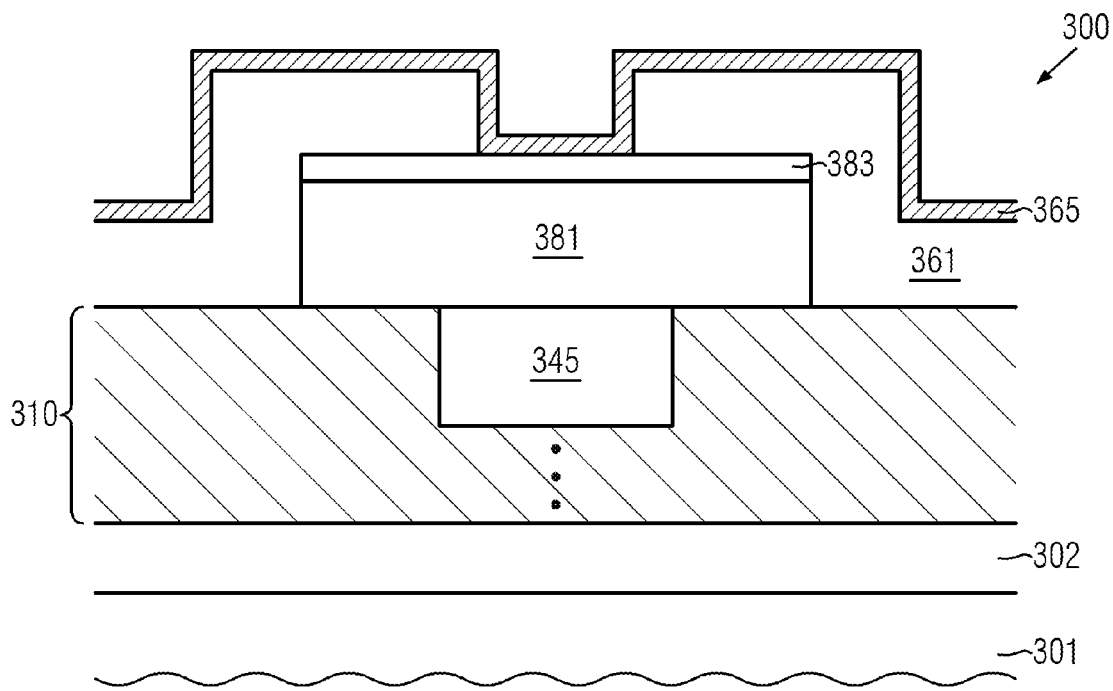

FIG. 3b schematically illustrates a cross-sectional view of the semiconductor device 300 in which a metal layer system 365 is formed in the opening 363 (FIG. 3a) and on the passivation layer 361. The metal layer system 365 is formed as described with reference to FIG. 2d, wherein, additionally, aspects concerning the adhesion of the metal layer system 365 to the passivation layer 361 are more relevant, as the metal layer system 365 remains finally also on a portion of the passivation layer 361, as will be described with reference to FIG. 3e.

Figure 3C:
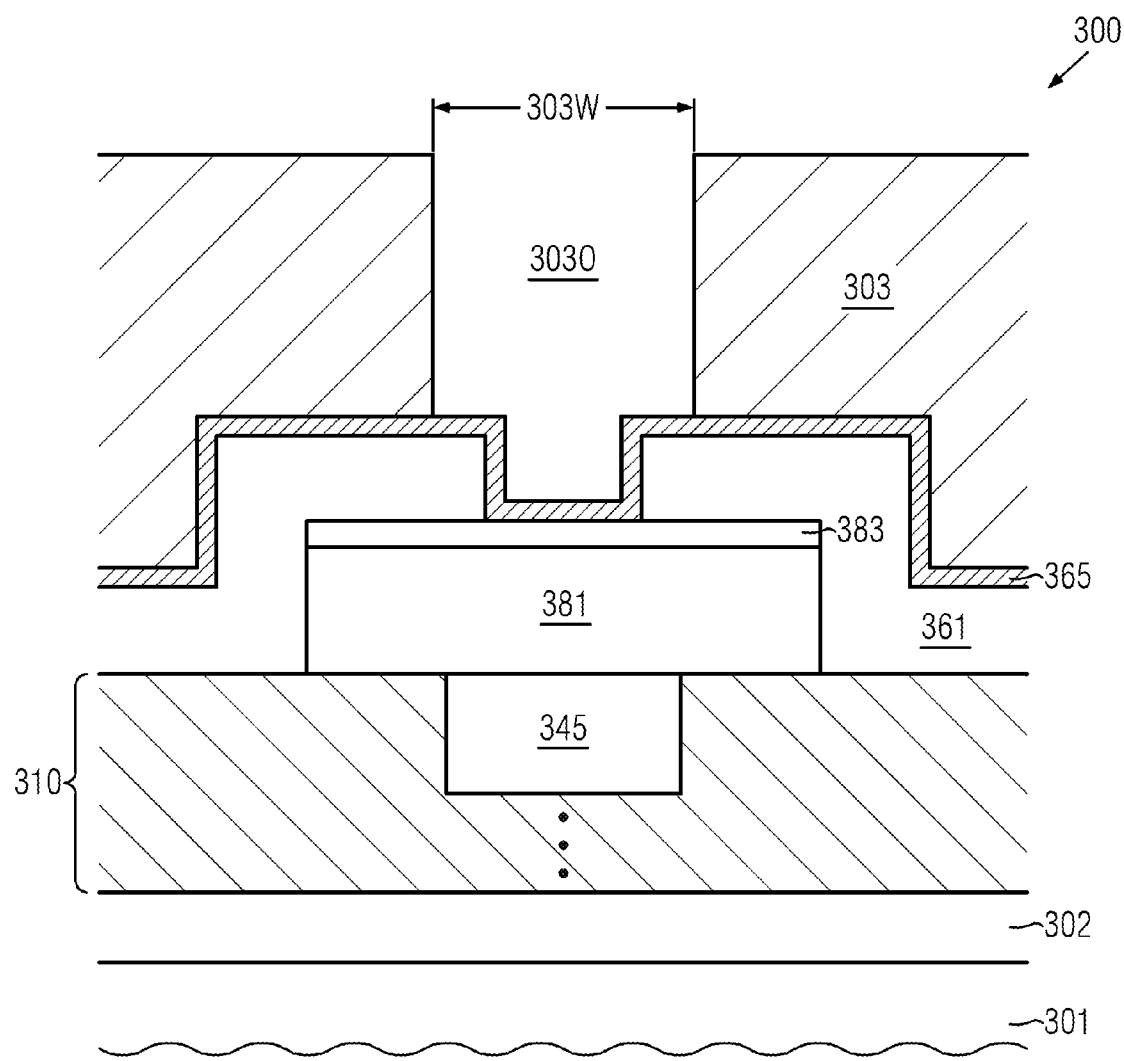

FIG. 3c schematically illustrates the semiconductor device 300 in a further advanced manufacturing stage in which a deposition mask 303, such as a resist mask, is formed above the metal layer system 365. The resist mask 303 comprises an opening 303O, wherein the lateral dimension 303W of the opening 303O may correspond to the diameter of the lateral size of the metal pillar to be formed in the opening 303O. Contrary to the corresponding resist mask 203 of the semiconductor device 200 as depicted in FIG. 2e, the width 303W is greater than the width 363W of the opening 363 (FIG. 3a) formed in the passivation layer 361.

Figure 3D:
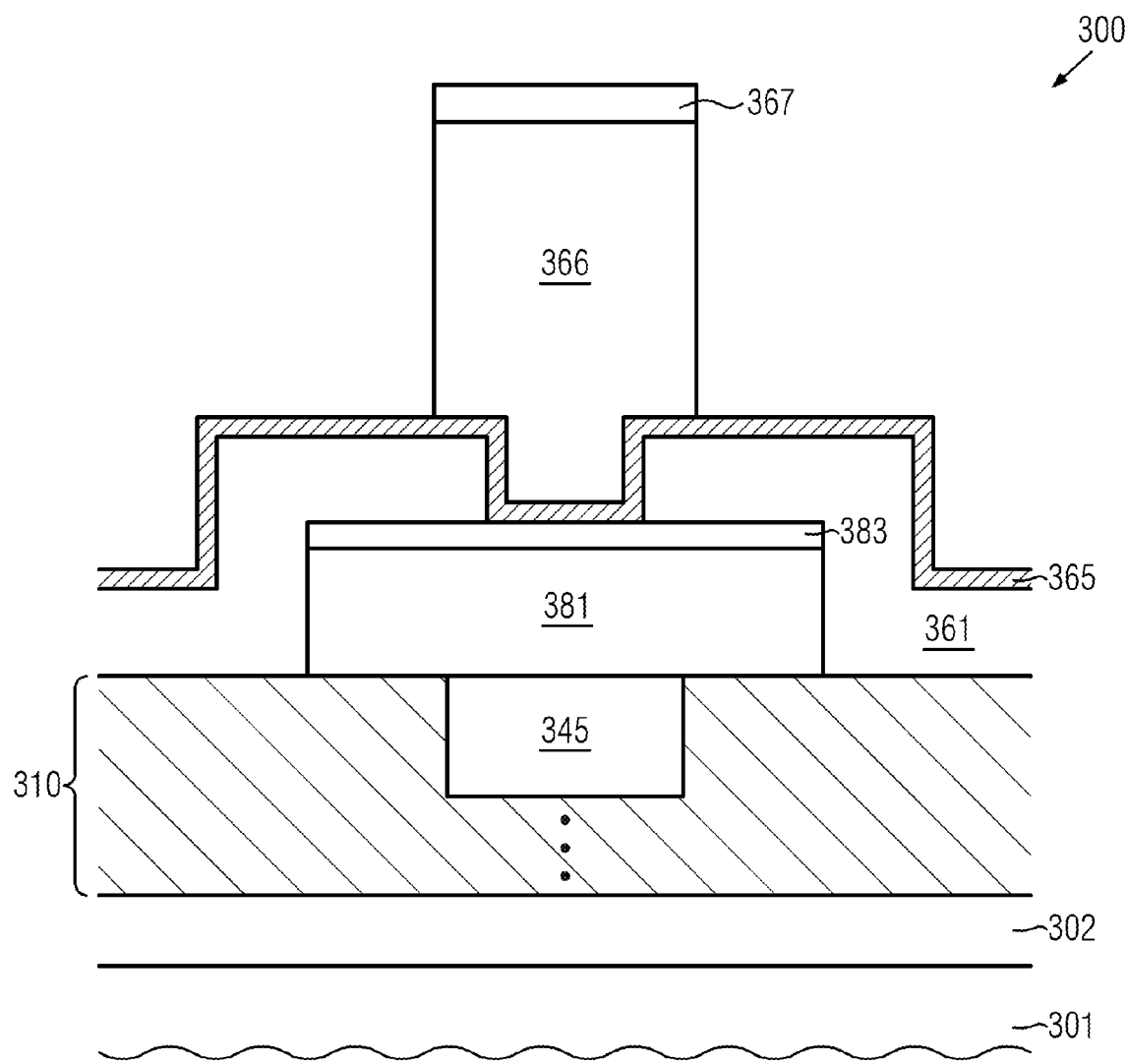

FIG. 3d schematically illustrates the semiconductor device 300 in a further advanced manufacturing stage in which a metal pillar 366 which may comprise a cap layer 367 is formed on the metal layer system 365 in the opening 303O (FIG. 3c) as previously described with reference to FIG. 2f. The metal pillar 366 is formed in the opening 363 (FIG. 3a) and on portions of the passivation layer 361 so that a lower portion of the metal pillar 366 is laterally embedded by the passivation layer 361 and the metal layer system 365.

Figure 3E:
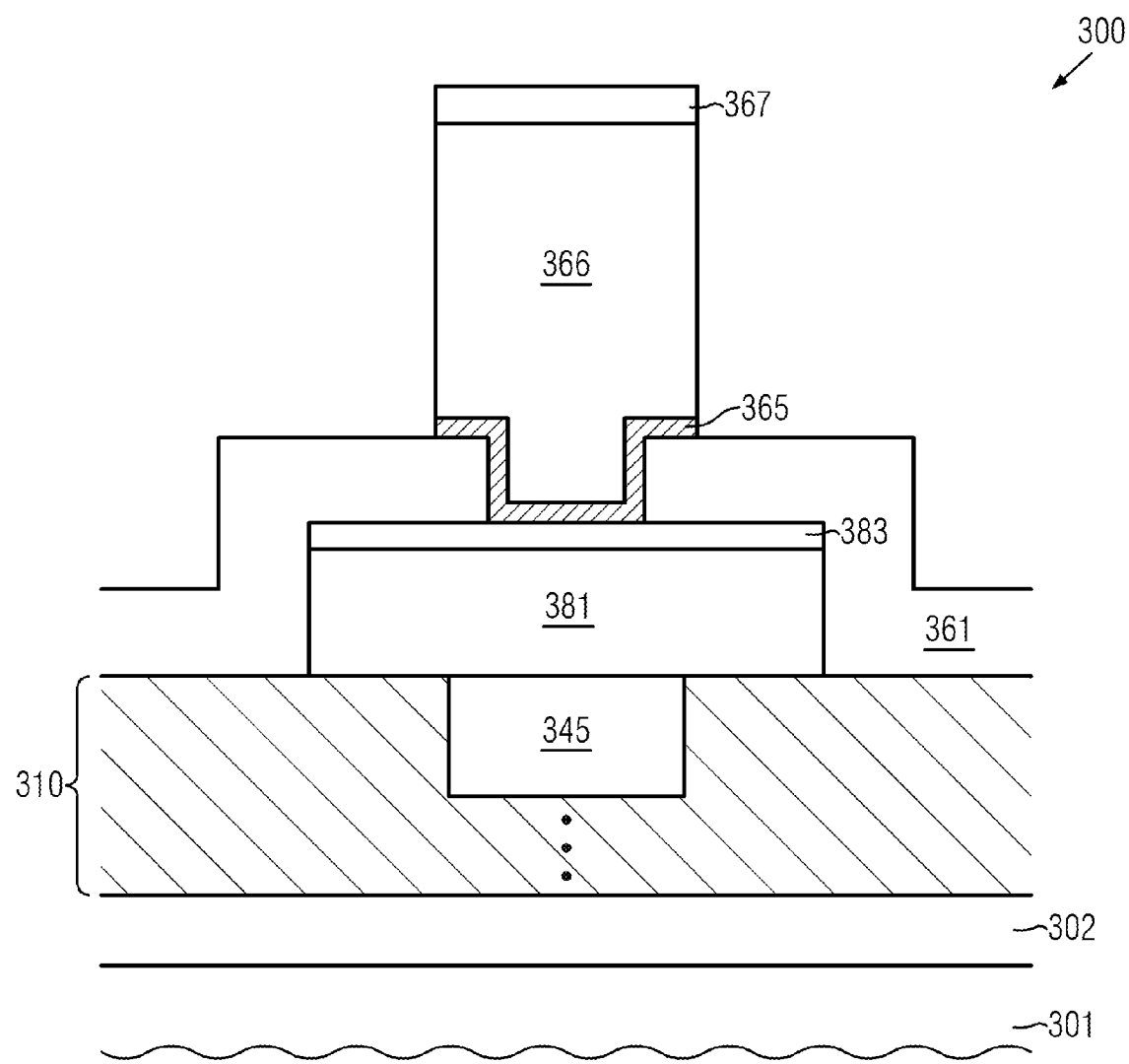

FIG. 3e schematically illustrates the semiconductor device 300 in a further advanced manufacturing stage in which exposed regions of the metal layer system 365 are removed as previously described with reference to FIG. 2g. Since the metal layer system 365 is removed from the passivation layer 361 only, the etch chemistry does not attack the material of the contact pad 381 and of the protection layer 383.

Figure 3F:
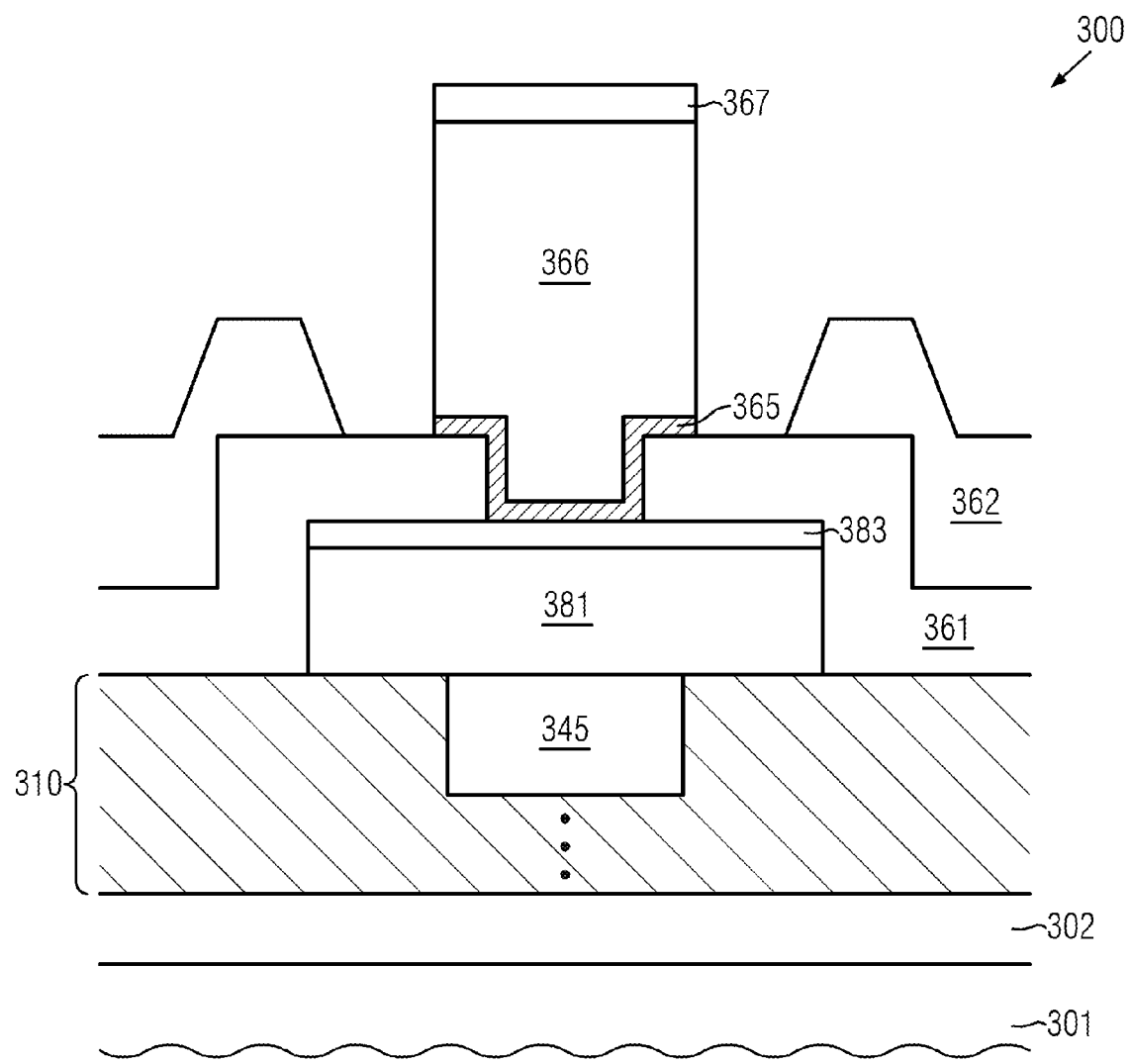

FIG. 3f schematically illustrates the semiconductor device 300 after the final substrate-based manufacturing process for forming a final passivation layer 362 that may comprise any appropriate passivation material, such as, e.g., polyimide. The contact pad 381 of the semiconductor device 300 is completely encapsulated and consequently the contact pad material is protected during and between dicing and packaging processes. Advantageously, a lower portion of the metal pillar 366 is laterally embedded in the passivation layer 361 so that mechanical sheer forces that may occur during packaging and operating of the device may be at least partially transferred to the passivation layer 361 so that the sheer force components transferred to the damageable metallization layer system 310 may be substantially reduced.

Figure 4:
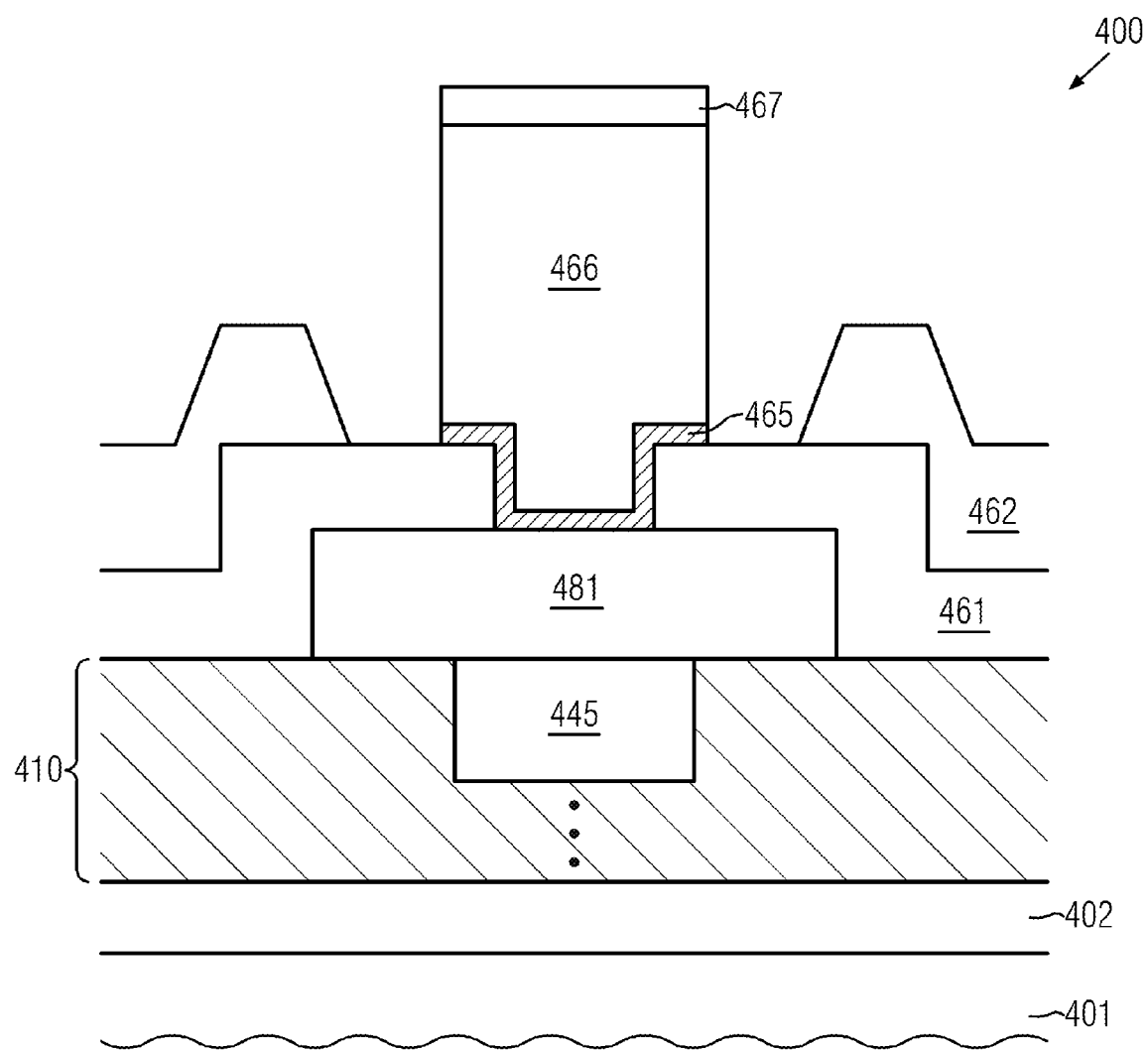
FIG. 4 schematically illustrates a cross-sectional view of a semiconductor device in which a lower portion of a metal pillar may be laterally embedded in a sub-layer of a passivation layer system, according to still further illustrative embodiments.

FIG. 4 schematically illustrates a semiconductor device 400 that is formed by manufacturing strategies described with reference to FIGS. 3a-3f, which, however, does not—contrary to the device 300—comprise a protection layer 383 formed on the contact pad 481. The semiconductor device 400 may comprise a substrate 401, a device level or semiconductor layer 402 and a metallization system 410 comprising a metal region 445 and may be formed as described with reference to FIG. 2a. Further, a metal pillar 466 that may comprise a cap layer 467 may be formed on the metal layer system 465 as described with reference to FIGS. 2d-2f. The semiconductor device 400 may further comprise passivation layers 461 and 462 as described with reference to FIGS. 2g and 2h.

As the protection layer 383 depicted in FIG. 3f protects the contact pad only during well-controlled manufacturing processes as depicted, for example, in FIGS. 3a and 3b, the protection layer may be omitted, i.e., the metal layer system 465 is formed directly on the contact pad 481—in this case, without unduly increasing the risk of damage of the contact pad material when the exposure of the contact pad during the processes described with reference to FIGS. 2b and 2c is optimized. Thus, semiconductor device 400 may also provide improved characteristics compared to conventional devices exposing the contact pad material to the atmosphere of the environment during and between dicing and packaging processes.

Figure 5:
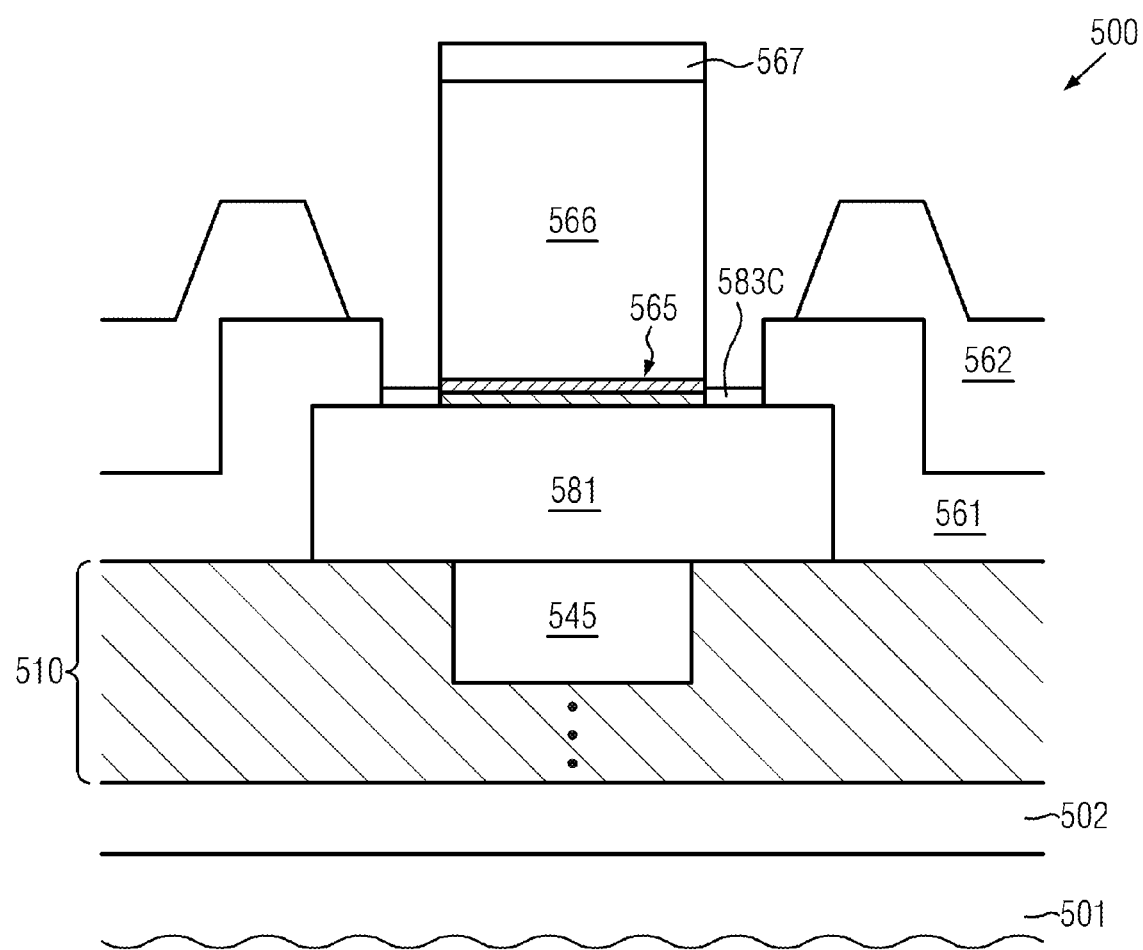
FIG. 5 schematically illustrates a cross-sectional view of a semiconductor device in which a protection layer is formed after a metal pillar, according to still further illustrative embodiments.

FIG. 5 schematically illustrates a semiconductor device 500 that is formed by manufacturing strategies described with reference to FIGS. 2a-2h, however, a protection layer 583C is formed only on the exposed regions of the contact pad 581 after removal of the exposed portions of the metal layer system 565. The semiconductor device 500 may comprise a substrate 501, a device level or semiconductor layer 502 and a metallization system 510 comprising a metal region 545 and may be formed as described with reference to FIG. 2a. Further, a metal pillar 566 that may comprise a cap layer 567 may be formed on the metal layer system 565 as described with reference to FIGS. 2d-2f. The metal layer system 565, however, is formed directly on the contact pad 581. The semiconductor device 500 may further comprise passivation layers 561 and 562 as described with reference to FIGS. 2g and 2h.

The protection layer 583C may be formed selectively on exposed regions of the contact pad 581 disposed between the metal pillar 566 and the passivation layer 561. The protection layer 583C may comprise a dielectric or a metallic material which may be formed by well-known deposition processes, such as chemical vapor deposition (CVD), electroless plating or atomic layer deposition (CVD) that may by performed selectively to pillar and passivation materials. In an illustrative embodiment, a metallic material of the protection layer 583C may comprise, e.g., tungsten.

Thus, semiconductor device 500 may also provide an improved characteristic compared to conventional devices exposing the contact pad material to the atmosphere of the environment during and between dicing and packaging processes as described with reference to FIG. 2h.

As a result, the present disclosure provides semiconductor devices and manufacturing techniques in which metal pillars providing the required electrical and thermal connection to a package substrate are arranged on contact pads which are protected during and between manufacturing, dicing and/or packaging processes and/or during etch processes performed to remove metal layers from the device in final substrate-based manufacturing stages. The contact pad material may be covered by a protection layer formed thereon prior or after metal pillar formation or may be protected by the metal pillars itself, thereby concurrently improving mechanical stress distribution, in particular, in low-k metallization layers of advanced semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a contact pad above a substrate comprising circuit elements;
forming a conductive protection layer protecting said contact pad;
depositing a passivation layer embedding said contact pad and covering said conductive protection layer;
forming an opening in said passivation layer;
depositing a metal layer system;
forming a metal pillar on said metal layer system in said opening; and
removing exposed portions of said metal layer system to expose a portion of said conductive protection layer.

2. The method of claim 1, wherein forming said contact pad and said conductive protection layer comprises:
forming a contact metal layer above said substrate;
forming a conductive protection material layer above said contact metal layer; and
forming said contact pad by patterning said conductive protection material layer and said contact metal layer.

3. The method of claim 1, wherein said conductive protection layer protects said contact pad during removal of said exposed portions of said metal layer system.

4. The method of claim 3, wherein said conductive protection layer comprises titanium aluminum nitride, titanium nitride, titanium, tantalum nitride or tantalum.

5. The method of claim 2, wherein said conductive protection layer is provided as a double layer comprising an upper and a lower sub-layer, wherein said upper sub-layer comprises the same material as said contact metal layer.

6. The method of claim 2, wherein said conductive protection layer is provided as a double layer comprising an upper and a lower sub-layer, wherein said upper sub-layer comprises aluminum.

7. The method of claim 1, wherein said passivation layer comprises at least one of silicon nitride, silicon oxide and silicon carbon nitride.

8. The method of claim 5, wherein said metal layer system comprises at least one of a Ti/Cu layer system and a TiW/Cu layer system.

9. The method of claim 1, wherein said contact metal layer comprises approximately 99 atomic percent and more aluminum and 1 atomic percent and less copper.

10. The method of claim 1, further comprising forming a cap layer comprising tin and silver on said metal pillar.

11. A semiconductor device, comprising:
a contact pad;
a horizontal protection layer disposed on an upper surface of said contact pad;
a passivation layer embedding said contact pad;
a metal pillar disposed in an opening in said passivation layer and above said contact pad, said opening exposing an upper surface portion of said horizontal protection layer between said metal pillar and a sidewall of said opening; and
a metal layer system disposed between said contact pad and said metal pillar.

12. The semiconductor device of claim 11, wherein said horizontal protection layer comprises titanium aluminum nitride, titanium nitride, titanium, tantalum nitride or tantalum.

13. The semiconductor device of claim 11, wherein said horizontal protection layer comprises an upper sub-layer and a lower sub-layer, said upper sub-layer comprising the same material as said contact pad.

14. The semiconductor device of claim 11, wherein said horizontal protection layer is laterally confined between said metal pillar and said sidewall of said opening in said passivation layer.

15. The semiconductor device of claim 11, wherein said contact pad comprises approximately 99 atomic percent and more aluminum and 1 atomic percent and less copper.

16. The semiconductor device of claim 11, wherein said horizontal protection layer is disposed between said contact pad and said metal layer system.

17. The method of claim 16, wherein said protection layer is formed selectively on an exposed portion of said contact pad.

18. A method, comprising:
forming a contact pad above a substrate comprising circuit elements;
depositing a passivation layer embedding said contact pad;
forming an opening in said passivation layer;
depositing a metal layer system;
forming a metal pillar on said metal layer system in said opening;
removing exposed portions of said metal layer system; and
forming a protection layer after removing said exposed portions of said metal layer system, said protection layer protecting said contact pad.

19. A method, comprising:
forming a contact pad above a substrate comprising circuit elements;
forming a protection layer protecting said contact pad, wherein said protection layer comprises an upper sub-layer and a lower sub-layer, said upper sub-layer comprising a same material as said contact pad;
depositing a passivation layer embedding said contact pad;
forming an opening in said passivation layer;
depositing a metal layer system;
forming a metal pillar on said metal layer system in said opening; and
removing exposed portions of said metal layer system.

20. The method of claim 1, further comprising, after removing exposed portions of said metal layer system to expose said portion of said conductive protection layer, forming a final passivation layer above said passivation layer, dicing said substrate into a plurality of chips, and packaging at least one of said plurality of chips to a respective carrier substrate.

21. The method of claim 1, wherein exposing said portion of said conductive protection layer comprises forming a recess in said conductive protection layer.

22. A semiconductor device, comprising:
a contact pad;
a protection layer formed on said contact pad, wherein said protection layer comprises an upper sub-layer and a lower sub-layer, said upper sub-layer comprising a same material as said contact pad;
a passivation layer embedding said contact pad;
a metal pillar disposed above said contact pad; and
a metal layer system disposed between said contact pad and said metal pillar.

* * * * *